US012315728B2

(12) United States Patent
Furukawa et al.

(10) Patent No.: US 12,315,728 B2
(45) Date of Patent: May 27, 2025

(54) METHOD FOR MANUFACTURING SEMICONDUCTOR DEVICE, SEMICONDUCTOR DEVICE, SEMICONDUCTOR MODULE, AND POWER CONVERSION DEVICE

(71) Applicant: Hitachi Power Semiconductor Device, Ltd., Hitachi (JP)

(72) Inventors: Tomoyasu Furukawa, Tokyo (JP); Tsubasa Moritsuka, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 162 days.

(21) Appl. No.: 18/251,207

(22) PCT Filed: Nov. 25, 2021

(86) PCT No.: PCT/JP2021/043156
§ 371 (c)(1),
(2) Date: Apr. 28, 2023

(87) PCT Pub. No.: WO2022/158114
PCT Pub. Date: Jul. 28, 2022

(65) Prior Publication Data
US 2023/0395382 A1 Dec. 7, 2023

(30) Foreign Application Priority Data

Jan. 22, 2021 (JP) .................................. 2021-008581

(51) Int. Cl.
H02M 7/5387 (2007.01)
H01L 21/265 (2006.01)
(Continued)

(52) U.S. Cl.
CPC ...... *H01L 21/26513* (2013.01); *H01L 21/324* (2013.01); *H02M 7/53871* (2013.01); *H10D 8/00* (2025.01); *H10D 8/01* (2025.01)

(58) Field of Classification Search
CPC ... H01L 21/26513; H01L 21/324; H10D 8/00; H10D 8/01; H02M 7/53871
See application file for complete search history.

(56) References Cited

U.S. PATENT DOCUMENTS 6,482,681 B1   11/2002 Francis et al.
10,050,106 B2 *  8/2018 Miyazaki ............. H01L 21/265
(Continued)

FOREIGN PATENT DOCUMENTS

CN       113053746 A    6/2021
EP        3451365 A1    3/2019
(Continued)

OTHER PUBLICATIONS

Office Action, dated Mar. 5, 2024, for German Application No. 11 2021 004 531.8 (with English translation).
(Continued)

*Primary Examiner* — Adolf D Berhane
(74) *Attorney, Agent, or Firm* — Baker Botts L.L.P.

(57) ABSTRACT

Provided are a semiconductor device and a power converting device utilizing a field-stop layer in a vertical semiconductor device with improved manufacturability using large-diameter wafers. A semiconductor device manufacturing method according to the present invention is characterized by: a step for, after a pattern on a main surface side of a drift layer of a first conductivity type is formed, irradiating ions from a second main surface side to a predetermined depth; a step for, after the ion irradiation, converting the ions into donors by anneal processing of heating at 300-450° C. for 60 seconds or less, thereby forming a field-stop layer; and a step (Continued)

for reducing the thickness of a semiconductor substrate to a predetermined value from the second main surface side such that a crystal defect having occurred in the ion irradiating step is eliminated.

10 Claims, 8 Drawing Sheets

(51) Int. Cl.
*H01L 21/324* (2006.01)
*H10D 8/00* (2025.01)
*H10D 8/01* (2025.01)

(56) References Cited

U.S. PATENT DOCUMENTS

| | | | |
|---|---|---|---|
| 11,942,512 B2* | 3/2024 | Furukawa | H10D 64/112 |
| 2014/0217407 A1 | 8/2014 | Mizushima et al. | |
| 2014/0299915 A1 | 10/2014 | Kouno et al. | |
| 2016/0020309 A1* | 1/2016 | Suzuki | H02M 7/5387 363/131 |
| 2016/0365250 A1 | 12/2016 | Matsui | |
| 2018/0090564 A1 | 3/2018 | Wakagi et al. | |
| 2018/0166279 A1 | 6/2018 | Tamura et al. | |
| 2024/0072124 A1* | 2/2024 | Miyata | H10D 62/60 |
| 2024/0313055 A1* | 9/2024 | Nagano | H10D 62/307 |

FOREIGN PATENT DOCUMENTS

| | | |
|---|---|---|
| JP | 2003-533047 A | 11/2003 |
| JP | 2008-211148 A | 9/2008 |
| JP | 2011-086891 A | 4/2011 |
| JP | 2013-138172 A | 7/2013 |
| JP | 2014-146721 A | 8/2014 |
| JP | 2018-056220 A | 4/2018 |
| WO | WO 2013/073623 A1 | 5/2013 |
| WO | WO 2016/035531 A1 | 3/2016 |
| WO | WO 2017/146148 A1 | 8/2017 |
| WO | WO 2017/188166 A1 | 11/2017 |

OTHER PUBLICATIONS

International Search Report, mailed Feb. 8, 2022, for International Application No. PCT/JP2021/043156.

International Preliminary Report on Patentability dated Sep. 27, 2022 with an amendment under PCT Article 34 dated Sep. 28, 2022, for International Application No. PCT/JP2021/043156 (without English translation).

* cited by examiner

METHOD FOR MANUFACTURING SEMICONDUCTOR DEVICE, SEMICONDUCTOR DEVICE, SEMICONDUCTOR MODULE, AND POWER CONVERSION DEVICE

TECHNICAL FIELD

The present invention relates to a method for manufacturing a semiconductor device, a semiconductor device, a semiconductor module, and a power conversion device.

BACKGROUND ART

A semiconductor device such as an insulated gate bipolar transistor (IGBT) and a p-Intrinsic-n diode (PIN diode) has a vertical structure. In the IGBT, a region including an N-type drift layer, an N-type buffer layer, and a P-type collector layer has a vertical structure, and in the diode, a region including an N-type drift layer, an N-type buffer layer, and an $N^+$ cathode layer has a vertical structure.

In the vertical semiconductor device such as the IGBT or the diode having the vertical structure region, for cost reduction, a wafer manufactured by a floating-zone (FZ) method is used as a Si wafer for manufacturing a semiconductor device instead of a wafer manufactured by epitaxial growth. In addition, in recent years, a diameter of the Si wafer has been increased. In order to reduce an on-voltage and a switching loss of the semiconductor device, thinning the n-type drift layer has been studied.

It is effective to thin the n-type drift layer constituting the semiconductor device in order to reduce the on-voltage and the switching loss of the semiconductor device. However, when a current drop at the time of switching is rapid and a natural extinction period of an accumulation carrier called a tail current is not particularly secured, there is a problem that the current rapidly disappears, a surge voltage ($L \cdot d_f/d_t$) proportional to a parasitic inductance in a main circuit is generated, and the semiconductor device oscillates at a frequency of several MHz or more.

There is a concern that these noises cause adverse effects such as motor insulation, overvoltage element breakdown, and element malfunction.

In order to solve problems about low switching loss and low switching noise, for example, the following related arts are disclosed.

PTL 1 discloses a technique of forming a deep n buffer layer made of an oxygen thermal donor continuously over a region having a thickness of 30 μm or more adjacent to an n-type layer to suppress an oscillation phenomenon due to a rapid decrease in a tail current. In addition, PTL 2 discloses a technique for forming a deep n buffer layer in which phosphorus (P) is applied to a dopant of the deep n buffer layer. PTL 3 discloses a technique for forming a deep n buffer layer in which hydrogen (proton) ion irradiation and subsequent annealing processing are applied. PTL 4 discloses a technique for forming a deep n buffer layer in which several n buffer layers are formed by proton irradiation multiple times.

CITATION LIST

Patent Literature

PTL 1: JP 2018-56220 A
PTL 2: JP 2014-146721 A
PTL 3: JP 2003-533047 A
PTL 4: WO 2017/146148 A

SUMMARY OF INVENTION

Technical Problem

However, in PTL 1, in order to generate the oxygen thermal donor, it is necessary to introduce an oxygen element into Si at a high temperature of 1000° C. or more for a long time in an initial process of manufacturing a wafer, and there is a concern about deterioration in economic efficiency of the process of manufacturing the wafer and deterioration in reliability of the IGBT and diode elements due to occurrence of slip accompanying an increase in weight of the wafer in the wafer at the time of applying a large-diameter (8 inches or more) wafer. Furthermore, there is a problem that the oxygen thermal donor is scraped off by thin wafer processing after the formation of an IGBT gate structure and an anode structure, and productivity is lowered.

In addition, as described in PTL 2, in a case where phosphorus (P) is applied to the dopant of the n buffer layer, annealing at a high temperature for a long time is required as in PTL 1, and there is a concern about deterioration in productivity and reliability due to the occurrence of slip. In addition, as in PTL 3 and PTL 4, in a case where the deep n buffer layer is formed by the hydrogen (proton) ion irradiation and subsequent annealing processing at 300° C. to 500° C. for 30 minutes to 5 hours, there are problems of characteristic variation due to deterioration of heat equalizing property in a wafer plane at the time of applying the large-diameter wafer, and a decrease in throughput. According to the study of the present inventors, it can be seen that when the annealing processing is shortened in order to improve productivity, a large number of crystal defects occurs in a proton irradiation region, a lifetime killer that reduces a lifetime of a carrier is excessively generated, and there is a problem that a switching noise deteriorates and a leakage current at the time of maintaining a withstand voltage increases.

The present invention has been made in view of the above-described problems, and it is an object of the present invention to provide a method for manufacturing a semiconductor device capable of improving manufacturability of a field stop layer (n buffer layer) of a vertical semiconductor device such as an IGBT and a PIN diode capable of using a large-diameter (8 inches or more) wafer, a semiconductor device, and a power conversion device using the same.

Solution to Problem

One aspect of the present invention for solving the above problems is a method for manufacturing a semiconductor device that includes a semiconductor substrate, a second conductivity type layer formed on a first main surface of the semiconductor substrate, a first conductivity type drift layer formed on a second main surface opposite to the first main surface of the semiconductor substrate, and a first conductivity type field stop layer formed on a surface of the first conductivity type drift layer on a second main surface side and having an impurity concentration higher than an impurity concentration of the first conductivity type drift layer. The method includes a process of irradiation with ions at a predetermined depth from the second main surface, a process of forming the field stop layer by converting the ions into donors by annealing processing that includes heating at 300° C. to 450° C. for 60 seconds or less after the ion irradiation, and a process of reducing a thickness of the semiconductor substrate to a predetermined value from the second main surface such that a crystal defect occurring in the process of irradiation with the ions is removed.

In addition, the present invention provides a semiconductor device, a semiconductor module, and a power conversion device manufactured by using the method for manufacturing a semiconductor device.

A more specific configuration of the present invention is described in the claims.

Advantageous Effects of Invention

According to the present invention, it is possible to provide the method for manufacturing a semiconductor device capable of improving manufacturability of the field stop layer (n buffer layer) of the vertical semiconductor device such as the IGBT and the PIN diode capable of using the large-diameter (8 inches or more) wafer, and the semiconductor device, the module, and the power conversion device manufactured by the manufacturing method.

Other objects, configurations, and effects will be made apparent in the following descriptions.

DESCRIPTION OF EMBODIMENTS

Hereinafter, the present invention will be described in detail with reference to the drawings.

Figure 1:
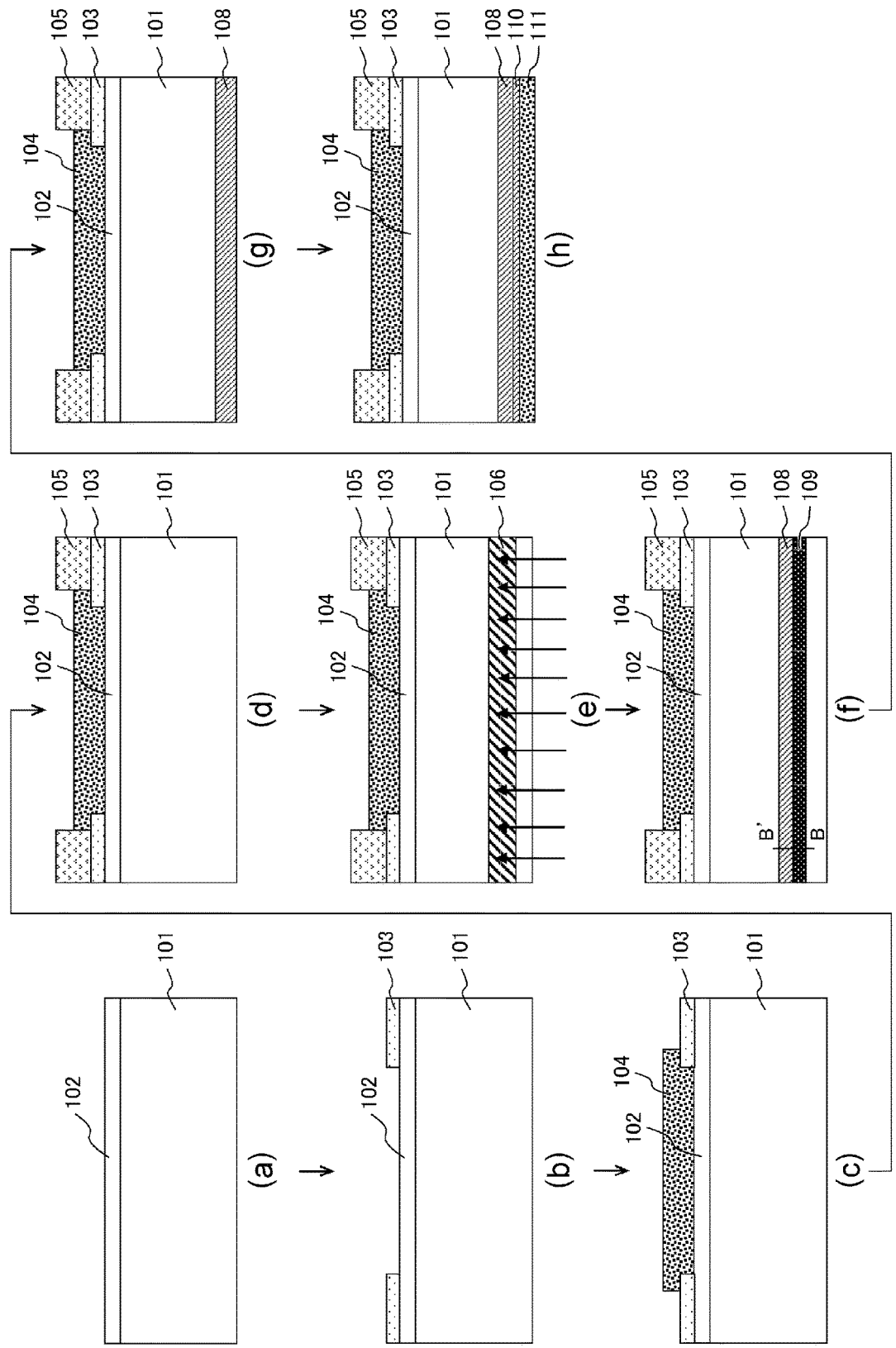
FIG. 1 is a flowchart illustrating a first example of a method for manufacturing a semiconductor device of the present invention.

FIG. 1 is a flowchart illustrating an example of a method for manufacturing a semiconductor device of the present invention. FIG. 1 is a part of processes of manufacturing a freewheel diode of a power semiconductor chip as a semiconductor device, and illustrates a manufacturing flow together with a cross-sectional structure of the semiconductor device. Note that an IGBT, a metal-oxide-semiconductor field-effect transistor (MOSFET), and the like that cause a current to flow in a vertical direction can be similarly applied as the semiconductor device.

In FIG. 1(a), a Si wafer 101 is prepared as a semiconductor substrate for manufacturing a diode. As will be described later, the present invention is suitable for manufacturing a semiconductor device having a wafer size of 8 inches or more, but can also be applied to manufacturing a semiconductor device having a wafer size smaller than such a size. The wafer size can have, for example, 8 inches and a Si wafer thickness of 725 µm and can have 12 inches and a Si wafer thickness of 775 µm. Here, a wafer having a specific resistance corresponding to a withstand voltage can be used as the Si wafer. For example, a diode having a withstand voltage of 1200 V can have a resistance of about 55 Ωcm, and a diode having a withstand voltage of 3.3 kV can have a resistance of about 250 Ωcm. Hereinafter, in FIGS. 1(a) to 1(h), a structure in which each layer is formed on the Si wafer 101 may be referred to as a "semiconductor substrate". In FIG. 1, an upper surface side of the Si wafer 101 is referred to as a first main surface, and a lower surface side is referred to as a second main surface.

In a first process not illustrated in FIG. 1(a), the entire surface of the Si wafer 101 (a first conductivity type n– drift layer) is thermally oxidized to form an oxide film. Subsequently, a photolithography process for forming a region where an anode p-type (second conductivity type) semiconductor layer 102 is provided is performed. In this photolithography process, a resist in which a region of the anode p-type semiconductor layer 102 is opened is formed by applying, exposing, and developing a resist material on the surface of the Si wafer 101. Thereafter, p-type impurities are ion-implanted. Examples of the p-type impurity include B (boron). Thereafter, the resist is removed, and annealing processing for activating impurities is performed. Thus, the anode p-type semiconductor layer 102 is formed as illustrated in FIG. 1(a).

In FIG. 1(b), an oxide film is formed on the Si wafer 101 by thermal oxidation, an insulating oxide film 103 is deposited by a chemical vapor deposition (CVD) method, and a photolithography process for forming a contact portion connecting the anode p-type semiconductor layer 102 and an anode electrode is performed. The insulating oxide film 103 is etched by using, as a mask, the resist formed by applying, exposing, and developing the resist material, and thus, the contact portion connecting the anode p-type semiconductor layer 102 and the anode electrode is formed.

In FIG. 1(c), the anode electrode 104 is formed by forming an anode electrode made of aluminum (Al) or an Al alloy by a sputtering method, patterning a resist by a photolithography process, and etching the patterned resist. In this manner, the anode p-type semiconductor layer 102 and the anode electrode 104 are formed on the first main surface side of the Si wafer 101.

In FIG. 1(d), a surface protective film 105 is formed. As a method for forming the surface protective film 105, for example, the surface protective film 105 can be formed by applying a solution containing a polyimide precursor material and a photosensitive material and exposing a termination region to polyimide the precursor.

In FIG. 1(e), ions are irradiated from the second main surface side of the Si wafer 101 to form an ion implantation layer 106. Here, the irradiation position of the ions (depth from the second main surface of the Si wafer 101) determines a thickness of an n-type (first conductivity type) field stop layer (n buffer layer) to be described later. Since it is necessary to sufficiently prevent a depletion layer from reaching at the time of maintaining the withstand voltage, the irradiation position of the ions is a position corresponding to each withstand voltage class of the semiconductor device. For example, the diode having a withstand voltage of 1200 V preferably has a depth of about 100 μm from the second main surface, and the diode having a withstand voltage of 3.3 kV preferably irradiates a depth position of about 400 μm.

Note that although not illustrated, a depth of the irradiation of the ions can be adjusted by adjusting irradiation energy or an absorber. For example, an aluminum member can be used as the absorber.

In addition, an ion irradiation surface of the Si wafer 101 may be preliminarily polished and then subjected to ion irradiation in a range (for example, a thickness of 600 μm) in which wafer cracking or excessive warpage due to a weight accompanying an increase in diameter does not occur.

As the ions, light ions are preferable, protons or helium are preferable, but ions that are not light ions may be used.

In FIG. 1(f), ion atoms implanted by irradiation become donors by performing annealing processing on the ion implantation layer 106 in FIG. 1(e), and an n-type field stop layer (n buffer layer) 108 is formed. Here, the annealing of the ion implantation layer 106 requires processing at 300° C. to 500° C. for 30 minutes to 5 hours by a heating furnace in the related art, and it has been difficult to sufficiently perform uniform heating in a wafer plane accompanying the increase in diameter of the wafer. In the present invention, in order to shorten a time for the annealing processing and perform uniform heating in the wafer surface, the annealing processing is performed in a single wafer type lamp annealing apparatus that processes wafers one by one at 300° C. to 450° C. for 60 seconds or less, in a $N_2$ atmosphere, in a $H_2$ atmosphere, or in a $N_2/H_2$ mixed gas atmosphere, and the ion implantation layer becomes a donor.

Figure 3:
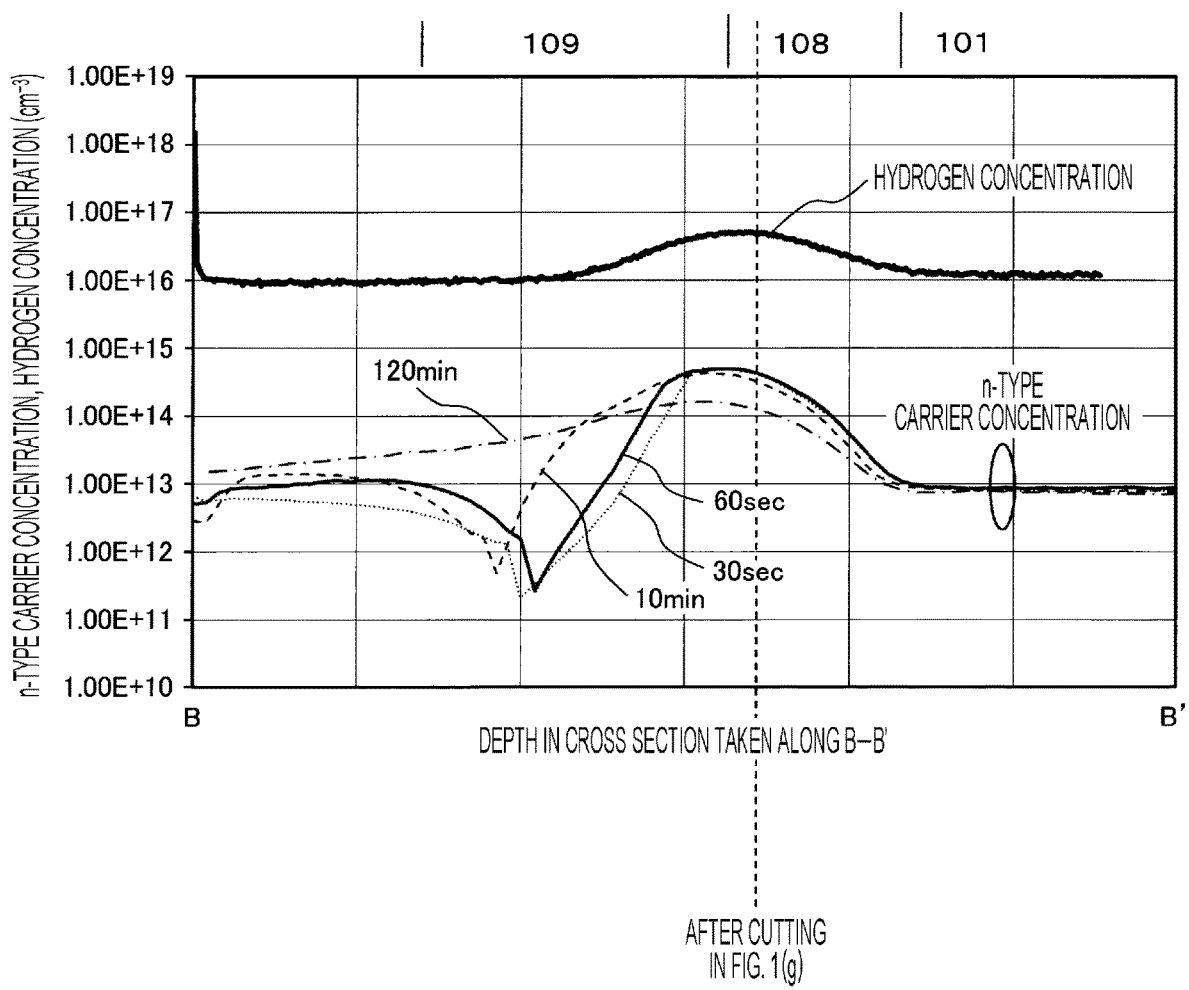
FIG. 3 is a graph showing distributions of an n-type carrier concentration and a hydrogen concentration in a cross section taken along line B-B' in process (f) of FIG. 1.

FIG. 3 is a graph showing a distribution of an n-type carrier concentration and a hydrogen concentration in a cross section taken along B-B' line in process (f) of FIG. 1, and shows a scene in which the ion implantation layer becomes the donor in the cross section taken along B-B' line. Protons (hydrogen) are implanted as the ions, and the annealing processing is performed at 400° C. in a $H_2$ atmosphere. Note that, in FIG. 3, an annealing time of 10 min or more (10 min: broken line and 120 min: dashed-dotted line) is a result of a heat treatment performed by a batch-type vertical heat treatment apparatus in the related art. As illustrated in FIG. 3, a gradient of the n-type carrier concentration is steeper in a case where the heat treatment is performed by the lamp annealing of the present invention having an annealing time of 60 sec or less than in a case where the heat treatment is performed by the heating furnace having an annealing time of 10 min or more in the related art.

Figure 4:
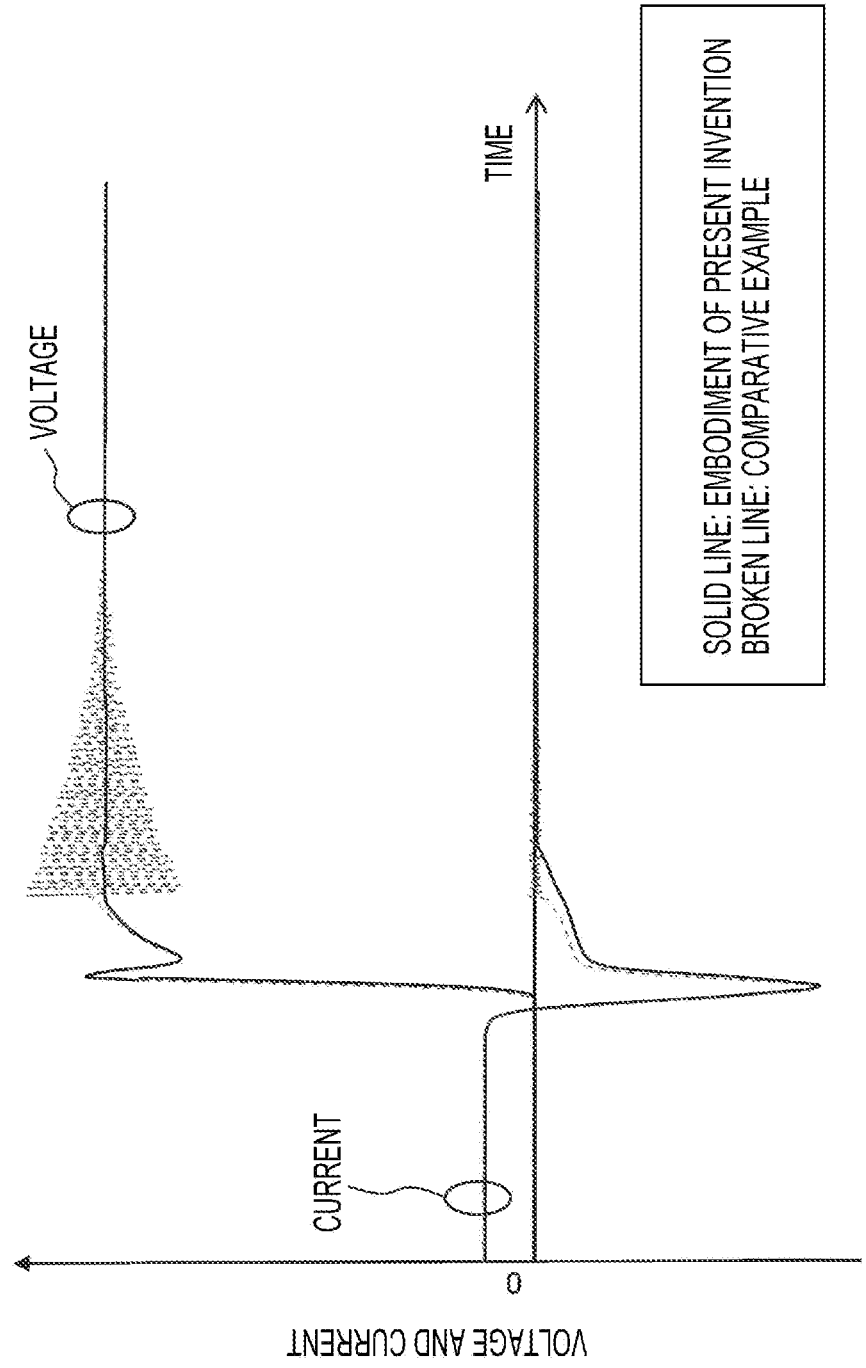
FIG. 4 is a graph showing a recovery waveform.
Figure 5:
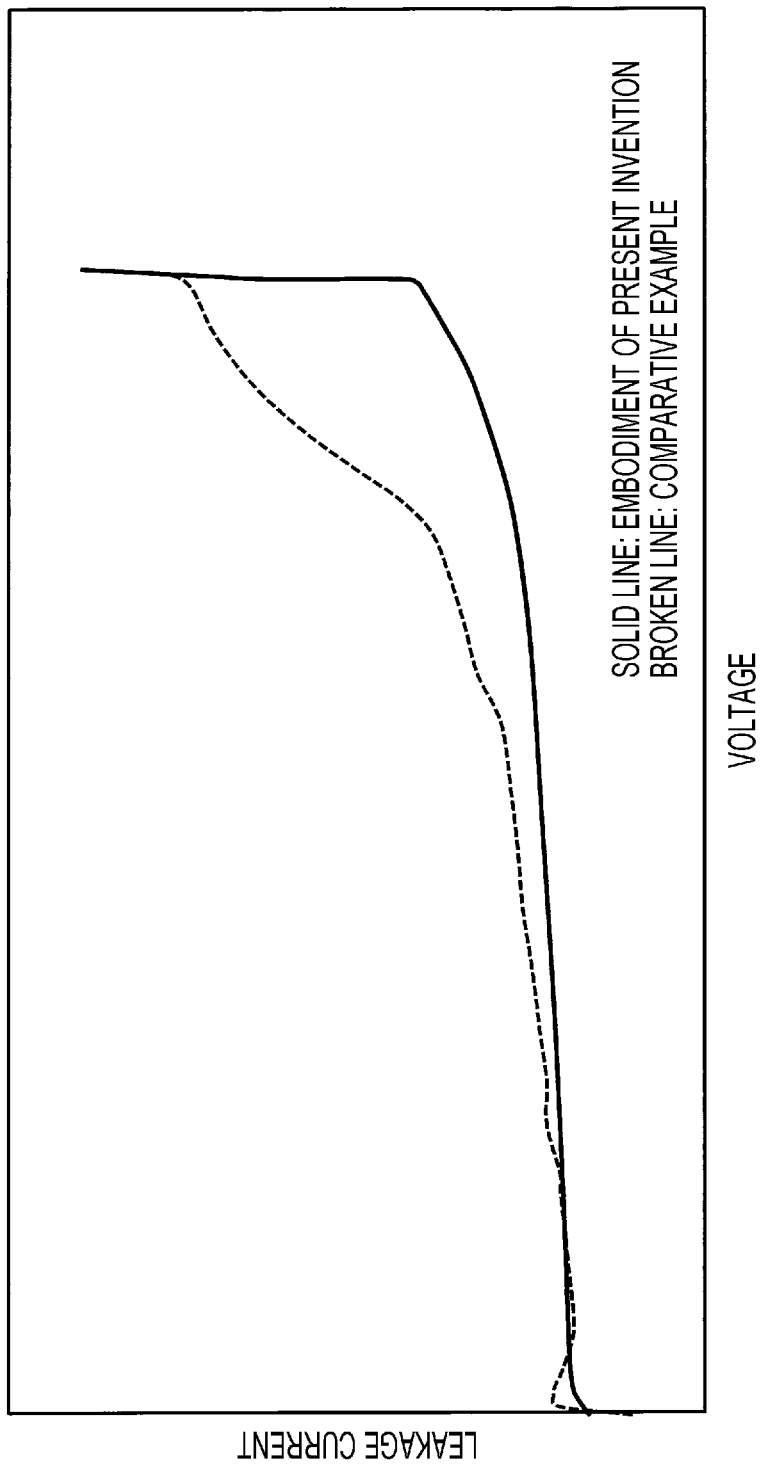
FIG. 5 is a graph showing a leakage current waveform.

FIG. 4 is a graph showing a recovery waveform, and FIG. 5 is a graph showing a leakage current waveform. In FIGS. 4 and 5, a solid line indicates a semiconductor device manufactured by the manufacturing method according to the embodiment of the present invention illustrated in FIG. 1, and a broken line indicates a semiconductor device manufactured by a manufacturing method of a comparative example. The comparative example is a case where a large amount of lifetime killers remain as a crystal defect region 109. In a procedure of forming the n-type field stop layer (n buffer layer) 108, in a region shallower than a peak concentration (concentration at which the n-type carrier concentration becomes highest) with respect to an ion implantation direction, a donor activity rate decreases, a large amount of crystal defects occur, and the crystal defect region 109 in which a large amount of lifetime killers that reduce a lifetime of the carrier are present is generated. As shown by broken lines in FIGS. 4 and 5, it can be seen that when a large amount of lifetime killers remain as the crystal defect region 109 as in the comparative example, there are problems such as deterioration of switching noise (FIG. 4) and an increase in leakage current at the time of maintaining the withstand voltage (FIG. 5). Meanwhile, it can be seen that the semiconductor device manufactured by the manufacturing method according to the embodiment of the present invention indicated by the solid lines in FIGS. 4 and 5 can reduce the deterioration of the switching noise (FIG. 4) and can also prevent the increase in leakage current at the time of maintaining the withstand voltage (FIG. 5).

Thereafter, although not illustrated, in order to reduce a switching loss, it is also possible to perform ion implantation for individual lifetime control on the main surface side of the Si wafer 101 on which the anode p-type semiconductor layer 102 is formed, the n-type field stop layer 108, or both the main surface side and the n-type field stop layer separately from the formation of the n-type field stop layer 108.

In FIG. 1(g), the crystal defect region 109 formed in the region shallower than the peak concentration is removed. For example, it can be scraped off by back grinding and a mixed solution of hydrofluoric acid and nitric acid.

Figure 6:
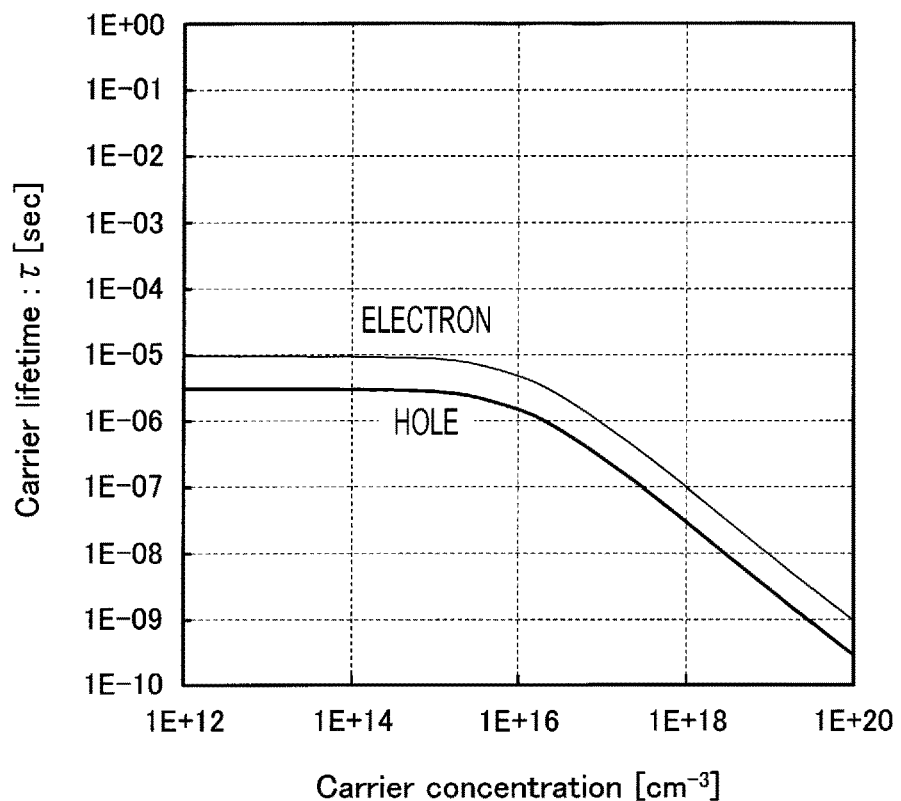
FIG. 6 is a graph showing a relationship between a carrier lifetime and an n-type carrier concentration.

FIG. 6 is a graph showing a relationship between a carrier lifetime and the n-type carrier concentration. Here, a final n-type field stop layer (n buffer layer or donor layer) 108 is desirably formed to have a carrier concentration of $1\times10^{15}$ cm$^{-3}$ or less. As illustrated in FIG. 6, when the carrier concentration exceeds $1\times10^{15}$ cm$^{-3}$, the carrier lifetime is rapidly shortened as the carrier concentration is higher. The carrier concentration is set to be $1\times10^{15}$ cm$^{-3}$ or less, and thus, it is possible to prevent carriers from excessively disappearing in an n buffer layer at the time of reverse recovery switching of the diode. Accordingly, it is possible to secure a tail current region, and thus, it is possible to suppress generation of ringing noise.

Figure 7:
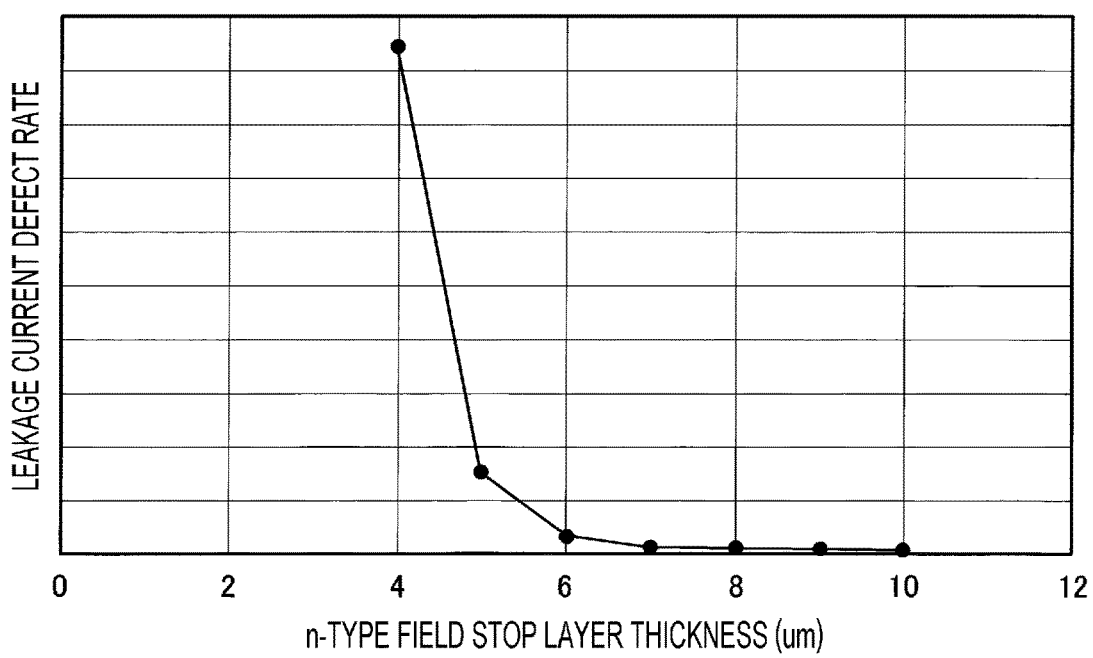
FIG. 7 is a graph showing a relationship between a leakage current defect rate and an n-type field stop layer depth.

In addition, a thickness of the n-type field stop layer 108 is preferably a depth of 10 μm or more according to the study of the inventor. FIG. 7 is a graph showing a relationship between a leakage current defect rate and a depth of the n-type field stop layer. As shown in FIG. 7, when the depth is 7 μm or less, since the increase in leakage current occurs at the time of maintaining the withstand voltage due to scratches on a back surface generated in a manufacturing process and an inspection process after a next process and processing accuracy of the back grinding and the mixed solution of hydrofluoric acid and nitric acid is approximately ±3 μm, the depth is preferably 10 μm or more in consideration of processing variations.

Figure 2:
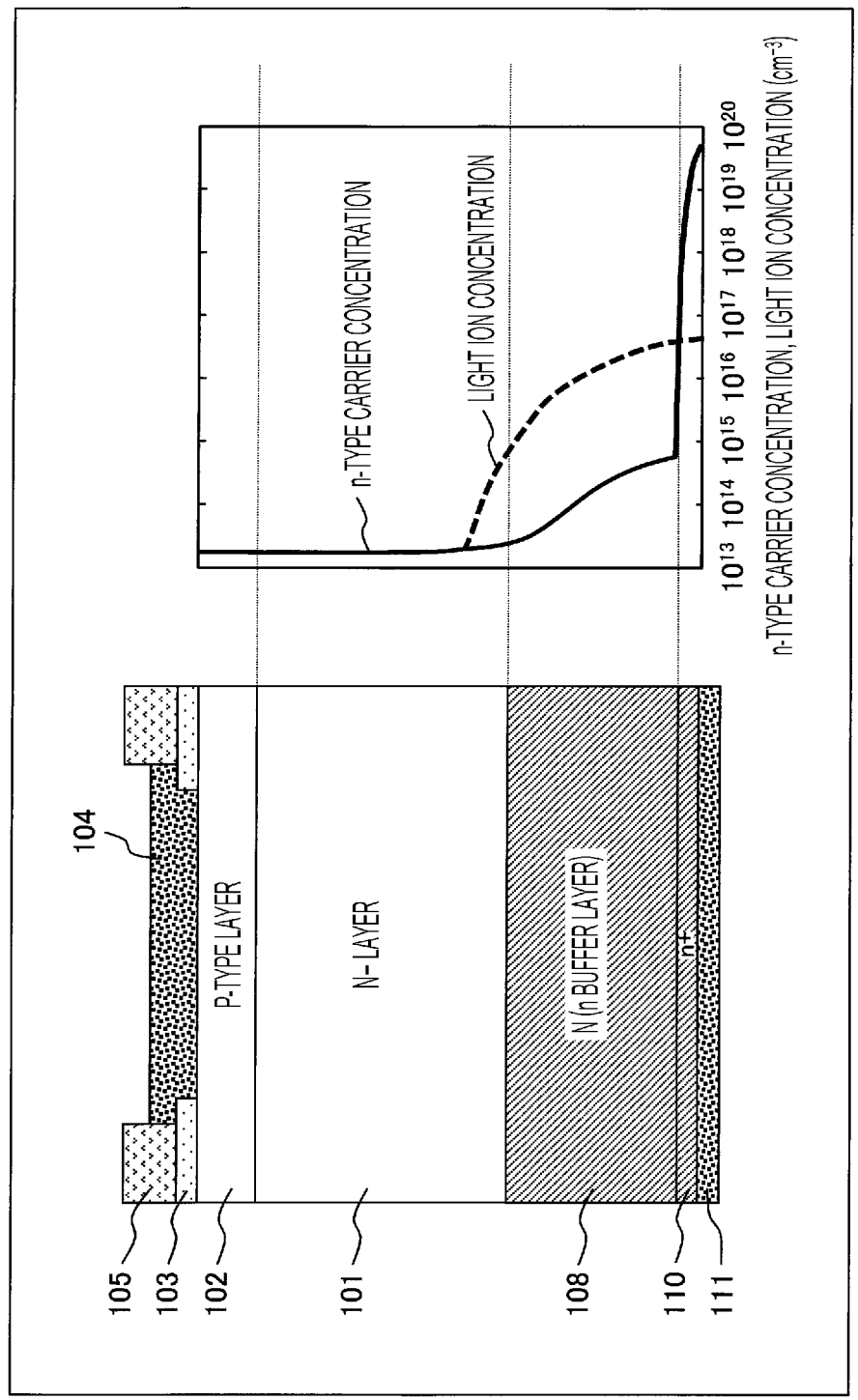
FIG. 2 is a schematic cross-sectional view of the semiconductor device after process (h) of FIG. 1 is completed, and a graph showing an n-type carrier concentration and a light ion concentration.

Accordingly, as illustrated in FIGS. 2 and 3, there is no crystal defect region 109, and it is necessary to remove the crystal defect region 109 and a part of the n-type field stop layer 108 (until a peak of the n-type carrier concentration is removed) to a predetermined value from the second main surface side such that the carrier concentration (n-type carrier concentration) increases with a positive slope from the n− drift layer (the layer of the Si wafer 101) toward the second main surface side.

Figure 8:
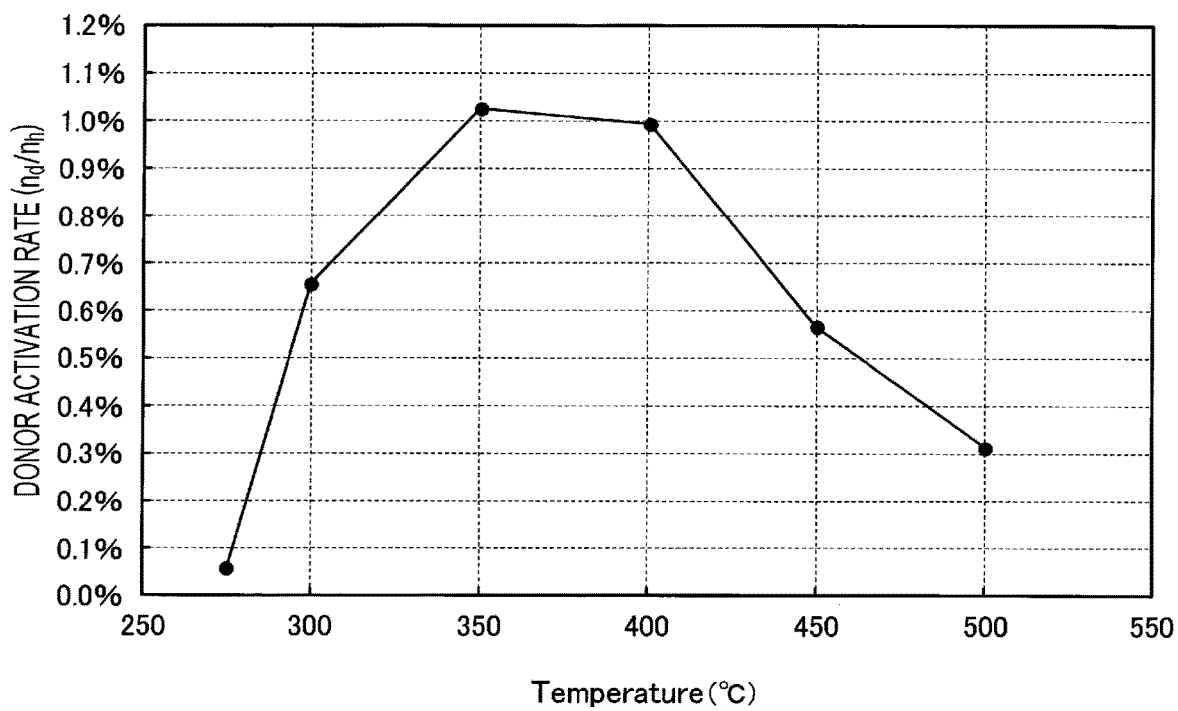
FIG. 8 is a graph showing a relationship between a donor activation rate and a temperature at the time of annealing for 60 seconds.

FIG. 8 is a graph showing a relationship between a donor activation rate and a temperature at the time of annealing for 60 seconds. FIG. 8 shows annealing processing temperature dependency of the donor activation rate which is a ratio ($n_d/n_h$) of an n-type carrier concentration $n_d$ to an ion (proton) concentration $n_h$ of the final n-type field stop layer 108.

As shown in FIG. 8, the activation rate is 0.5% or more in a range from 300° C. to 450° C., and particularly, the activation rate is 1% or more in a range from 350° C. to 400° C., which is the highest and stable. Accordingly, an annealing processing temperature is preferably from 300° C. to 450° C., and more preferably from 350° C. to 400° C. The annealing processing temperature is set to be 300° C. to 450° C., and thus, the semiconductor device has a stable n-type carrier concentration. Since the activation rate is high, an ion implantation amount can be reduced. Accordingly, variations are small, and the semiconductor device can be manufactured at low manufacturing cost.

Figure 9:
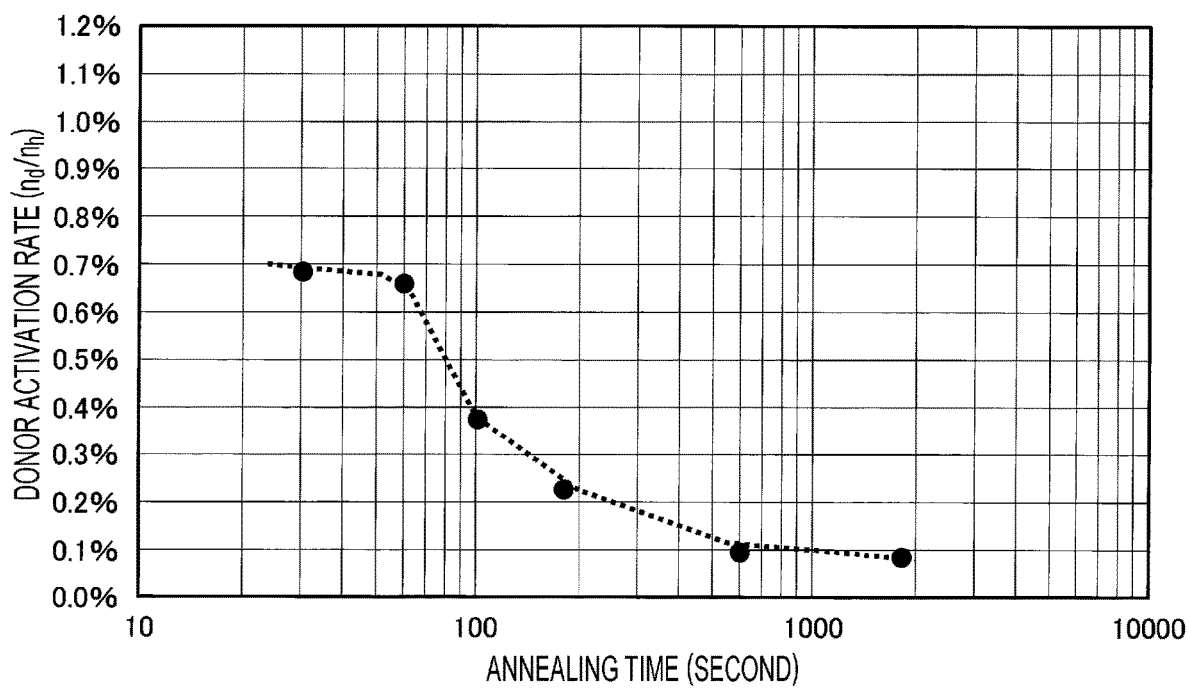
FIG. 9 is a graph showing a relationship between a donor activation rate and an annealing time at the time of annealing at 300° C.

FIG. 9 is a graph showing a relationship between the donor activation rate and the annealing time at the time of annealing at 300° C. As shown in FIG. 9, the activation rate is 0.5% or more when the annealing time is 70 sec or less.

From the above, the annealing processing is preferably performed in the range from 300° C. to 450° C. for 60 sec or less. In addition, the time is preferably 1 sec or more.

In FIG. 1(*h*), ion implantation of n-type impurities is performed from the second main surface side of the semiconductor substrate. Examples of the n-type impurity include phosphorus (P) and arsenic (As). Thereafter, laser annealing is performed to activate the ion-implanted n-type impurities, and an n+-type semiconductor layer 110 is formed. A cathode electrode 111 is formed in a stacked structure of, for example, AlSi alloy/titanium (Ti)/nickel (Ni)/gold (Au) by sputtering.

FIG. 2 is a schematic cross-sectional view of the semiconductor device after process (h) in FIG. 1, and a graph showing the n-type carrier concentration and the ion concentration. With the above configuration, it is possible to manufacture a diode in which the carrier concentration of the n-type field stop layer (n buffer layer) 108 illustrated in FIG. 2 is $1 \times 10^{13}$ cm$^{-3}$ or less, the thickness of the n− type field stop layer is 10 µm or more, there is no crystal defect region 109, and the carrier concentration increases with the positive slope from the n− drift layer (the layer of the Si wafer 101) toward the second main surface side.

According to the method for manufacturing a semiconductor device of the present invention described above, the conversion of the ions implanted into the n-type field stop layer 108 to donors is performed by the lamp annealing heat treatment, and thus, it is possible to perform uniform heating particularly in a large-diameter wafer.

According to the method for manufacturing a semiconductor device of the present invention described above, it is possible to provide a semiconductor device in which a low on-voltage and a low switching loss of the semiconductor device are improved, radio frequency oscillation due to noise at the time of switching is suppressed, and a leakage current at the time of maintaining the withstand voltage which is a factor of element breakdown and deterioration is reduced.

Note that, in addition to the processes described with reference to FIG. 1, a process of manufacturing a semiconductor device in a state where a large-diameter wafer is mounted on a base material and separating the base material and the semiconductor device after completion may be added. In this case, this process can also serve as a process of removing a part of the n-type field stop layer 108 and the crystal defect region 109 described above, and the manufacturing process can be simplified.

Figure 10:
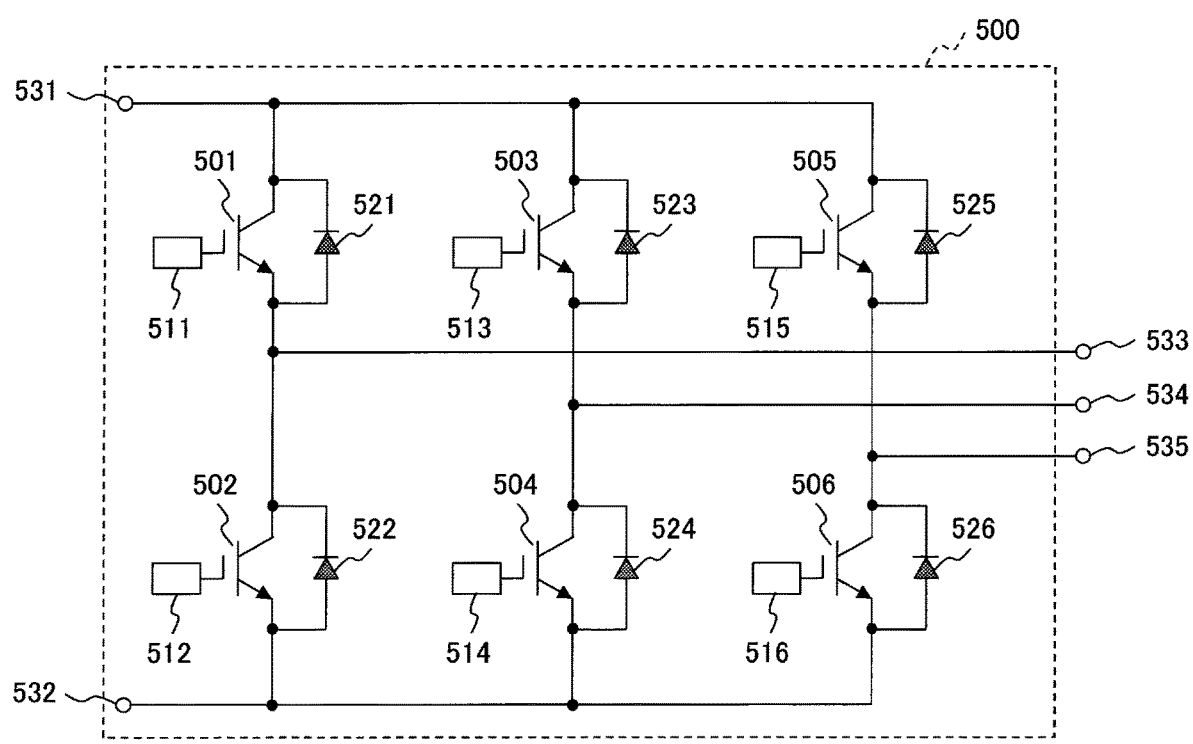
FIG. 10 is a circuit diagram illustrating a schematic configuration of a power conversion device of the present invention.

FIG. 10 is a circuit diagram illustrating a schematic configuration of a power conversion device of the present invention. A second embodiment in which the semiconductor device of the present invention is applied to the power conversion device will be described with reference to FIG. 10. FIG. 10 illustrates an example of a circuit configuration of a power conversion device 500 of the present embodiment and a connection relationship between a DC power supply and a three-phase AC motor (AC load).

In the power conversion device 500 of the present embodiment, the semiconductor device manufactured by the method for manufacturing a semiconductor device of the present invention described above is used as any or all of power switching elements 501 to 506 and diodes 521 to 526. The power switching elements 501 to 506 are, for example, IGBTs.

As illustrated in FIG. 10, the power conversion device 500 of the present embodiment includes a P terminal 531 and an N terminal 532 which are a pair of DC terminals, and a U terminal 533, a V terminal 534, and a W terminal 535 which are AC terminals in the number corresponding to the number of phases of an AC output.

In addition, the power conversion device includes a switching leg formed by series connection of the pair of power switching elements 501 and 502 and having the U terminal 533 connected to a series connection point as an output. In addition, the power conversion device includes a switching leg formed by series connection of the power switching elements 503 and 504 having the same configuration and having the V terminal 534 connected to a series connection point as an output. In addition, the power conversion device includes a switching leg formed by the power switching elements 505 and 506 having the same configuration and having the W terminal 535 connected to a series connection point as an output.

The switching legs for three phases including the power switching elements 501 to 506 are connected between the DC terminals of the P terminal 531 and the N terminal 532, and a DC power is supplied from a DC power supply (not illustrated). The U terminal 533, the V terminal 534, and the W terminal 535 which are three-phase AC terminals of the power conversion device 500 are connected to a three-phase AC motor (not illustrated) as a three-phase AC power supply.

The power switching element 501 and the diode 521 connected in reversely parallel to the power switching element 501 are connected to form a parallel circuit. Similarly, the power switching element 502 and the diode 522, the power switching element 503 and the diode 523, the power switching element 504 and the diode 524, the power switching element 505 and the diode 525, and the power switching element 506 and the diode 526 are connected to form a parallel circuit. The parallel circuit including the power switching element 501 and the parallel circuit including the power switching element 502 are connected in series. Similarly, the parallel circuit including the power switching element 503 and the parallel circuit including the power switching element 504 are connected in series, and the parallel circuit including the power switching element 505 and the parallel circuit including the power switching element 506 are connected in series.

Gate circuits 511 to 516 are connected to input terminals of gates of the power switching elements 501 to 506 as the IGBTs, and the power switching elements 501 to 506 are controlled by the gate circuits 511 to 516. Note that the gate circuits 511 to 516 are integrally controlled by an integrated control circuit (not illustrated).

The gate circuits 511 to 516 integrally and appropriately control the power switching elements 501 to 506 such that the DC power of the DC power supply is converted into a three-phase AC power and is output from the U terminal 533, the V terminal 534, and the W terminal 535.

The method for manufacturing a semiconductor device of the present invention described above is applied to the power conversion device 500. Accordingly, it is possible to provide a power conversion device in which a low on-voltage and a low switching loss are improved, radio frequency oscillation due to noise at the time of switching is suppressed, and a leakage current at the time of maintaining the withstand voltage which is a factor of element breakdown and deterioration is reduced.

As described above, according to the present invention, it has been shown that it is possible to provide a method for manufacturing a semiconductor device capable of reducing an on-voltage, reducing a switching loss, and suppressing radio frequency oscillation due to noise at the time of switching while improving manufacturability of a field stop layer (n buffer layer), and reducing a leakage current at the time of manufacturing the withstand voltage which is a factor of element breakdown or deterioration in a vertical semiconductor device such as an IGBT and a PIN diode capable of using a large-diameter (8 inches or more) wafer, a semiconductor device manufactured by using the method, and a power conversion device using the same.

Note that the present invention is not limited to the aforementioned embodiments, and includes various modification examples.

For example, the aforementioned embodiments are described in detail in order to facilitate easy understanding of the present invention, and are not limited to necessarily include all the described components. In addition, some of the components of a certain embodiment can be substituted into the components of another embodiment, and the components of another embodiment can be added to the component of a certain embodiment. In addition, another component can be added, removed, and substituted to, from, and into some of the components of the aforementioned embodiments.

For example, although "first conductivity type" and "second conductivity type" in the present specification have been described as "n-type" and "p-type", respectively, "first conductivity type" and "second conductivity type" may be "p-type" and "n-type", respectively.

REFERENCE SIGNS LIST

101 Si wafer (n− drift layer)
102 p-type layer
103 insulating oxide film
104 anode electrode
105 surface protective film
106 light ion implantation layer
108 n-type field stop layer (n buffer layer)
109 crystal defect region
110 n+-type semiconductor layer
111 cathode electrode
500 power conversion device
501 to 506 power switching element
511 to 516 gate circuit
521 to 526 diode
531 P terminal
532 N terminal
533 U terminal
534 V terminal
535 W terminal

The invention claimed is:

1. A method for manufacturing a semiconductor device that includes a semiconductor substrate, a second conductivity type layer formed on a first main surface of the semiconductor substrate, a first conductivity type drift layer formed on a second main surface opposite to the first main surface of the semiconductor substrate, and a first conductivity type field stop layer formed on a surface of the first conductivity type drift layer on a second main surface side and having an impurity concentration higher than an impurity concentration of the first conductivity type drift layer, the method comprising:
    a process of forming the field stop layer by irradiation with ions at a predetermined depth from the second main surface;
    a process of converting the ions to donors by annealing processing that includes heating the field stop layer at 300° C. to 450° C. for 60 seconds or less after the ion irradiation; and
    a process of reducing a thickness of the semiconductor substrate to a predetermined value from the second main surface so that a crystal defect occurring in the process of forming the field stop layer due to irradiation with the ions is removed.

2. The method for manufacturing a semiconductor device according to claim 1, wherein, after the process of reducing the thickness of the semiconductor substrate to the predetermined value, a carrier concentration of the field stop layer increases with a positive slope from the first conductivity type drift layer toward the second main surface side.

3. The method for manufacturing a semiconductor device according to claim 1, wherein the annealing processing in the process of forming the field stop layer is performed for one second or more.

4. The method for manufacturing a semiconductor device according to claim 1, wherein a carrier concentration of the field stop layer after the process of reducing the thickness of the semiconductor substrate to the predetermined value is $1 \times 10^{15}$ cm$^{-3}$ or less.

5. The method for manufacturing a semiconductor device according to claim 1, wherein a thickness of the field stop layer after the process of reducing the thickness of the semiconductor substrate to the predetermined value is 10 μm or more.

6. The method for manufacturing a semiconductor device according to claim 1, wherein a donor activation rate which is a ratio of a carrier concentration to an ion concentration of the field stop layer after the process of reducing the thickness of the semiconductor substrate to the predetermined value is 0.5% or more.

7. The method for manufacturing a semiconductor device according to claim 1, wherein a size of the semiconductor substrate is 8 inches or more.

8. A semiconductor device manufactured by using claim 1.

9. A semiconductor module comprising the semiconductor device according to claim 8.

10. A power conversion device comprising:
    a pair of DC terminals;
    AC terminals, the number of the AC terminals corresponding to the number of phases of an AC output; and
    switching legs, the number of the switching legs corresponding to the number of phases of the AC output, the switching legs being connected between the pair of DC terminals, and two parallel circuits, each including a switching element and a diode connected in reversely parallel to the switching element, being connected in series; and gate circuits that control the switching elements, wherein at least one of the switching element and the diode is the semiconductor device manufactured by the method for manufacturing a semiconductor device according to claim 1.

\* \* \* \* \*